United States Patent
Dahm et al.

(10) Patent No.: US 6,647,401 B1
(45) Date of Patent: Nov. 11, 2003

(54) HIGH SPEED EMULATION OF ARITHMETIC OPERATIONS

(75) Inventors: David Michael Dahm, Mission Viejo, CA (US); Michael James Irving, Mission Viejo, CA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/418,549

(22) Filed: Oct. 14, 1999

(51) Int. Cl.$^7$ ................ G06F 7/00; G06F 7/38
(52) U.S. Cl. ................ 708/204; 708/495
(58) Field of Search ................ 708/200, 204, 708/495

(56) References Cited

U.S. PATENT DOCUMENTS 5,161,117 A * 11/1992 Waggener, Jr. ............ 708/204
5,687,106 A * 11/1997 Schwarz et al. ............ 708/204
5,889,980 A * 3/1999 Smith, Jr. .................. 708/204

* cited by examiner

Primary Examiner—Chuong Dinh Ngo
(74) Attorney, Agent, or Firm—Phuong-Quan Hoang; Mark T. Starr; Lise A. Rode

(57) ABSTRACT

A method of executing arithmetic operations in a data processing apparatus wherein first and second numbers having a main frame "e-mode format are converted to IEEE double format. Arithmetic operations are then performed using the first and second numbers in IEEE double format to form a result in IEEE double format. The IEEE double format result is then converted back to main frame e-mode format. The conversion of the first and second e-mode numbers to IEEE format includes a step of shifting a mantissa of each e-mode number by a single step of subtracting $2^{Nexp}$ where Nexp is the exponent of the IEEE double under formation.

24 Claims, 5 Drawing Sheets

FORMAT OF AN E-MODE SINGLE PRECISION NUMBER

FORMAT OF AN IEEE DOUBLE

CONVERT AN IEEE NUMBER (N) TO AN EMODE NUMBER (E)

HIGH SPEED EMULATION OF ARITHMETIC OPERATIONS

A portion of the disclosure of this patent document contains material that is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The subject invention relates generally to computer systems and more particularly to a process for increasing the speed of arithmetic operations in a system where emulation software is employed to cause a plurality of microprocessors to emulate a prior art mainframe computer.

BACKGROUND OF THE INVENTION AND RELATED ART

In the past, emulation software has been employed together with a number of microprocessor chips to emulate mainframe hardware. Such emulation software is comprised of many processes, each of which emulates a piece of prior art hardware, such as a central processor, an I/O processor or a task control unit. Emulation of arithmetic operations poses a particular problem in that the format used to represent numbers in a mainframe computer may be incompatible with the format used by the microprocessor. As a result, a long series of time consuming steps has conventionally been used to perform what desirably should be relatively simple and quick one-instruction arithmetic operations.

SUMMARY OF THE INVENTION

The invention provides a method of quickly converting numbers from mainframe format to that used by the microprocessor. The microprocessor is then instructed to perform a selected arithmetic operation on the converted numbers. The result of the arithmetic operation is then converted back to mainframe format for further processing. The arithmetic operations may include addition, subtraction, multiplication or division.

The particular example or embodiment of the invention disclosed hereinafter concerns microprocessor-implemented conversion of numbers from a particular main frame format known as "e-mode" to a standard IEEE double format. Arithmetic operations are then performed on the IEEE doubles with the result being converted back to e-mode format.

Various objects, features and advantages of the present invention will become readily apparent to those skilled in the art from the following detailed description, wherein is shown and described only the preferred embodiment of the invention, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive, and what is intended to be protected by Letters Patent is set forth in the appended claims. The present invention will become apparent when taken in conjunction with the following description and attached drawings, wherein like characters indicate like parts, and which drawings form a part of this application.

DETAILED DESCRIPTION OF THE PREFERRED EMBODIMENT

Figure 1:
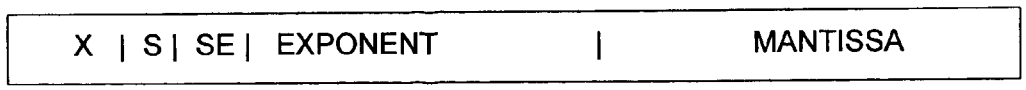
FIG. 1 illustrates the format of a main frame "e-mode" number.

FIG. 1 illustrates the bit structure of a word in so-called "e-mode" format. The word comprises 48 bits numbered 0–47 with 47 being the highest bit. Bit 47 is not used. Bit 46 is a sign bit, while bits 39–45 are a base 8 exponent, the top bit 45 being the sign bit of the exponent. Bits 0–38 comprise a 39 bit mantissa. The actual value of the number is $(m)(8^e)$, i.e., the mantissa multiplied by 8 to the "e" power where "e" is the exponent.

Figure 2:
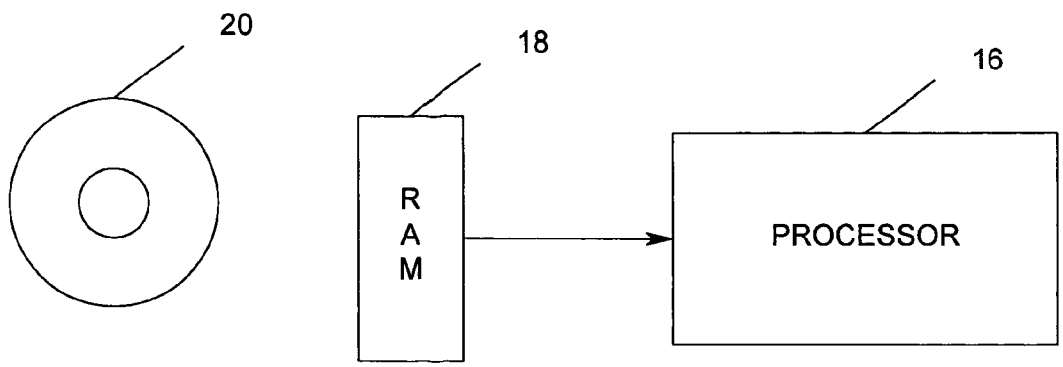
FIG. 2 is a block diagram illustrating data processing apparatus according to the preferred embodiment.

One environment where arithmetic operations on such e-mode numbers must be performed is in a system which employs a plurality of microprocessor chips to emulate a prior art main frame computer. Such a plurality of microprocessor chips may comprise a processor 16 as shown in FIG. 2. In FIG. 2, the processor 16 may comprise, for example, two or four microprocessors. Each of the microprocessors may be, for example, an Intel Pentium Zeon operating at 500 MHz. The processor 16 is caused to emulate a desired main frame computer by emulation software contained in a random access memory (RAM) 18. The emulation software is typically loaded into RAM 18 from a CD ROM 20. In one embodiment, the processes of the emulation software each emulate an actual piece of prior art main frame hardware, such as a central processor, an I/O processor and a Task Control Unit (TCU). It should be understood that the just described emulation environment is but one example of a system wherein the preferred embodiment may find application.

Figure 3:
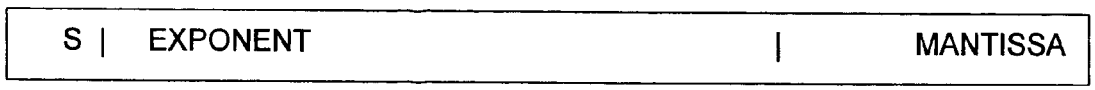
FIG. 3 illustrates the format of an IEEE double.

Various microprocessors and particularly those made by Intel require that arithmetic operations be performed on numbers which are in IEEE format—a standard format developed by the Institute of Electrical and Electronic Engineers. As illustrated in FIG. 3, words in IEEE "double" format have 64 bits, numbered 0–63, with bit 63 being the highest bit in the word. Bit 63 is a sign bit, bits 62–52 constitute an 11-bit exponent which is a biased power of 2 [the actual exponent is bits 62 through 52, minus 1075], and the remaining bits 51 to 0 constitute a 52 bit mantissa. The IEEE further increased precision of the format by eliminating the leading "1" which is always present in a normalized mantissa, except when the number is zero. Thus, in converting an IEEE double to e-mode, it is necessary to insert the leading 1, shorten the mantissa to 39 bits, shift the mantissa down, and modify the exponent to be a power of eight, rather than a power of two.

Figure 4:
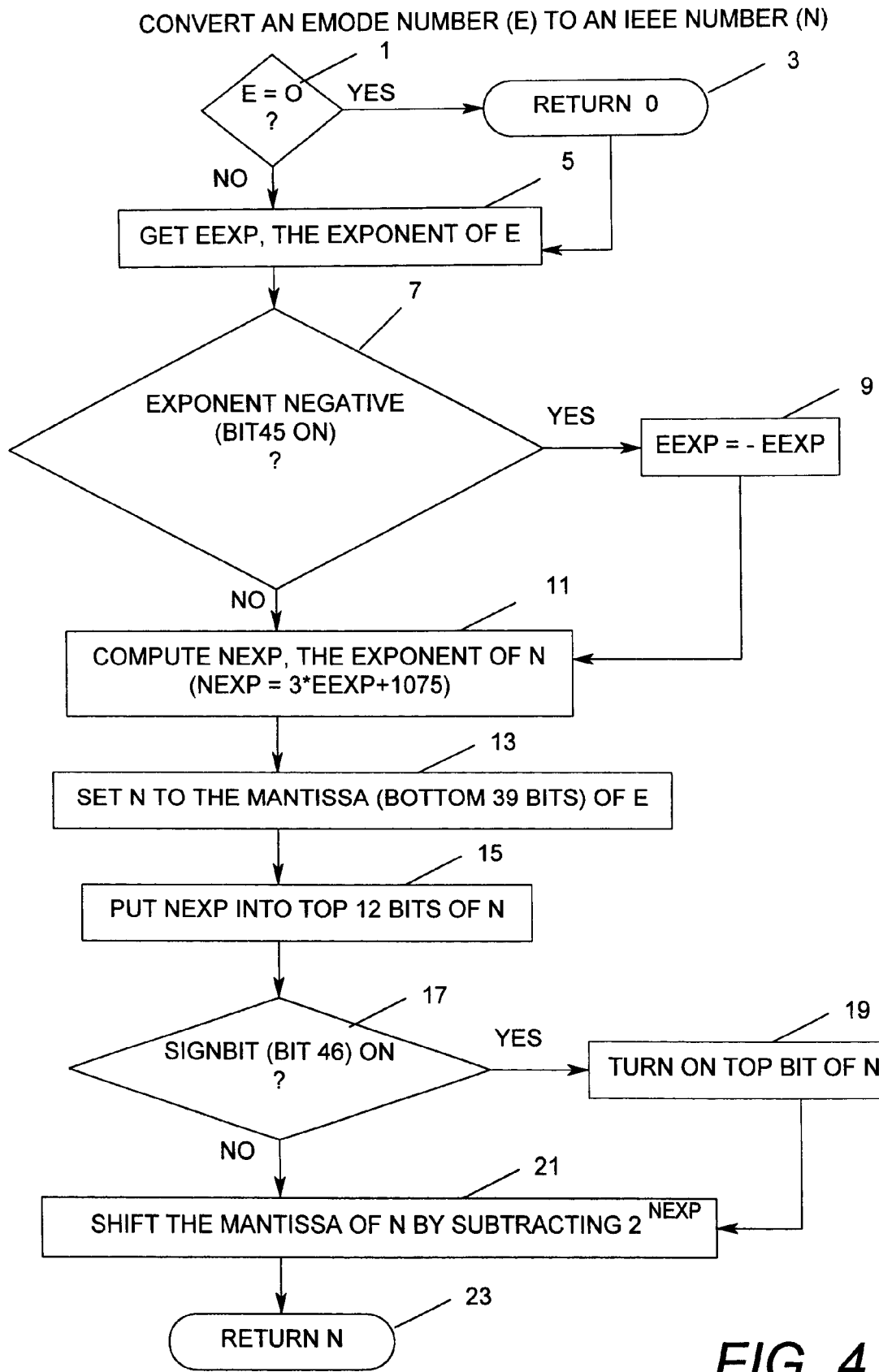
FIG. 4 is a flow diagram illustrating a process and method for converting an e-mode number to IEEE double format according to the preferred embodiment.
Figure 5:
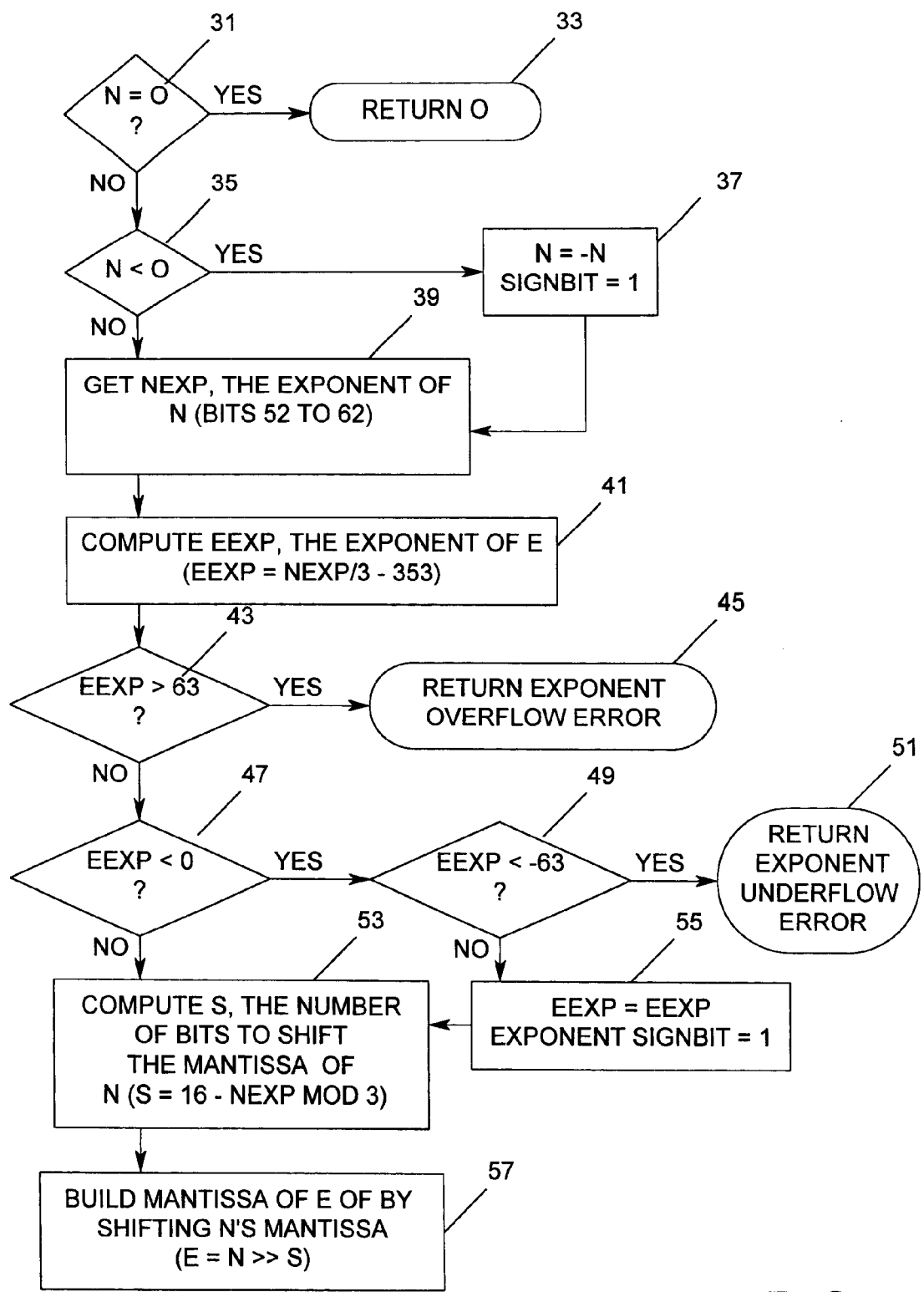
FIGS. 5 and 6 comprise a flow diagram illustrating a process and method for converting a number in IEEE double format into e-mode format.
Figure 6:
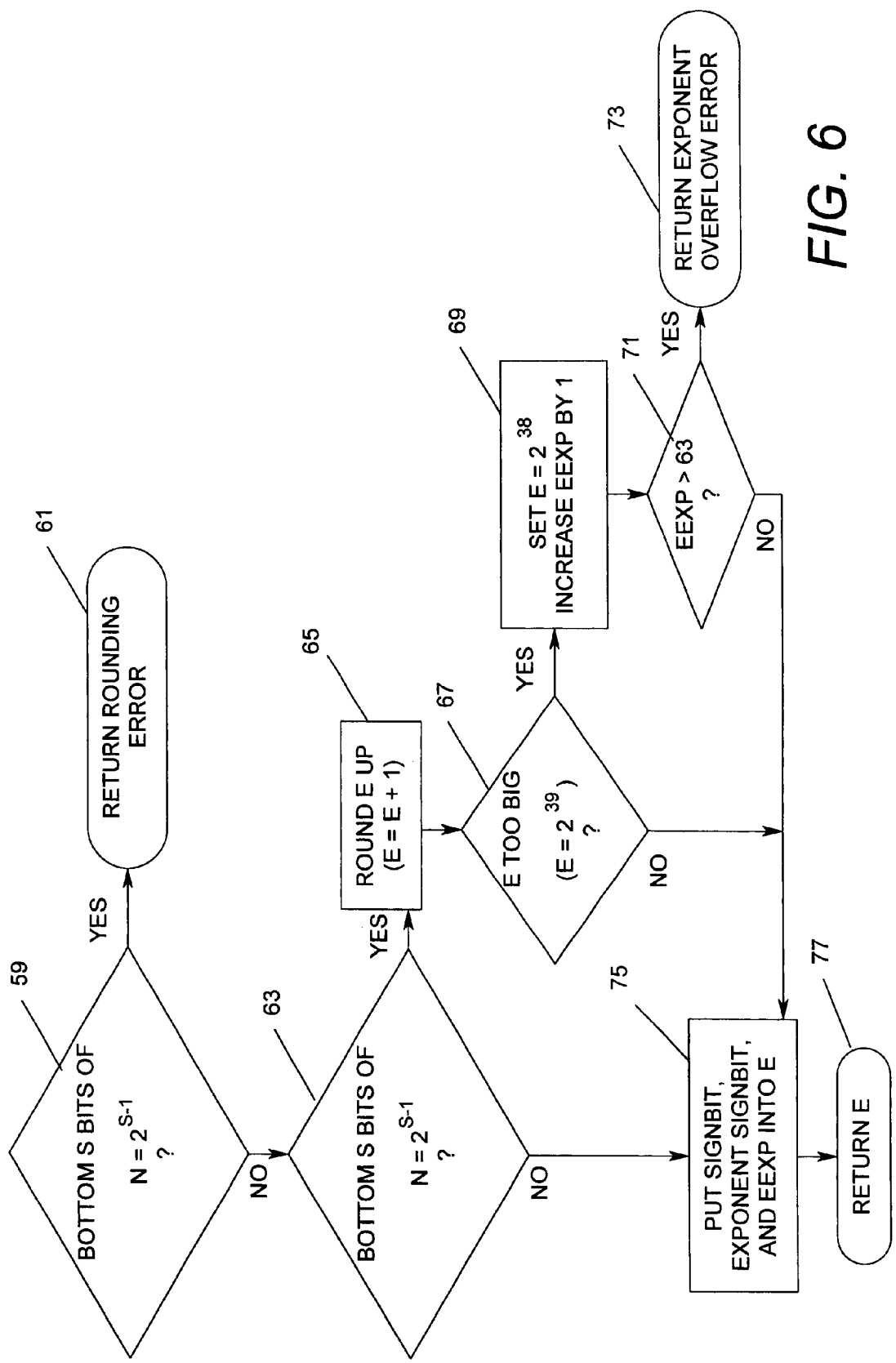

FIG. 4 illustrates a microprocessor implementable process for converting an e-mode number to IEEE format, while FIGS. 5–6 illustrate a microprocessor implementable process for converting an IEEE format number back to e-mode.

In a preferred embodiment, these processes are programmed in "C" to run on an Intel microprocessor. Thus, for example, when an application program requires addition of two e-mode operands, the first process converts the operands to IEEE format, and the "add" is executed by a single hardware add operator, for example, such as a single Intel Pentium "add" operator. Multiplication and division are similarly achieved by executing simple and fast multiply and divide operators against IEEE format multiplier/multiplicands or divisor/dividends.

The preferred process for converting an e-mode number (E), real or integer, to an IEEE number (N) is illustrated in FIG. 4. In step 1, the e-mode number is first tested to determine whether it is zero. If so, a zero is returned in step 3. If not, the routine proceeds to step 5 where the exponent Eexp of the e-mode number is obtained. Step 7 determines whether bit 45 is "on", i.e., whether the exponent of the e-mode number is negative. If so, the exponent is changed to positive in step 9, and the routine then proceeds with step 11. In step 11, the exponent of the IEEE format number Nexp is calculated. According to the equation employed, Nexp equals three times Eexp, plus 1075. Performance of this calculation converts the e-mode exponent to a power of "2" and biases it through addition of the number "1075".

In the next step 13, the construction of an IEEE number (N) is begun by setting N equal to the mantissa (bottom 39 bits) of the e-mode number. This is achieved in the Intel processor by a masking operation, which isolates the bottom 39 bits. In step 15, Nexp is placed into the top 12 bits of the IEEE number. In step 17, the sign bit (bit 46) of the e-mode number is tested. If the sign bit is "on", the routine proceeds to step 19 wherein the top bit (bit 63) of the IEEE number is turned on.

At this point, the number under formation has the correct exponent, but the mantissa is still the e-mode mantissa. The correct mantissa can be formed by shifting all the bits to the left and eliminating the high order bit. However, a problem exists because one does not know at this point how far to shift. Actually performing a series of operations to eliminate the "1" and shift the bits up would be extremely cumbersome and would make the conversion procedure relatively slow and unattractive. However, according to the preferred embodiment, it has been discovered that a simple, single step of subtracting of $2^{Nexp}$ from the e-mode mantissa produces the correct result, including eliminating the "1", without ever calculating how far to shift. Accordingly, in step 21, the mantissa of the IEEE number is shifted by subtracting $2^{Nexp}$. At this point, the e-mode number has been converted to IEEE format and the number N is returned for further processing.

FIGS. 5 and 6 illustrate the preferred process for converting an IEEE number (N) to an e-mode number (E). First, a test 31 is performed to determine whether the IEEE number N is 0. If so, 0 is returned to the program in step 33. If not, a test 35 is performed to determine whether the IEEE number N is less than 0. If so, step 37 is performed wherein N is converted to a positive number, and the value of the signbit is set to 1.

In step 39, the exponent of the IEEE number N is obtained. This exponent occupies bits 52–62 of the IEEE number N. In the next step 41, the exponent of the e-mode number is determined. This exponent Eexp is determined by dividing Nexp by 3 and subtracting 353. Next, the e-mode exponent determined in step 41 is tested at tests 43 and 47 to determine whether it is greater than 63 or less than 0. If the e-mode exponent calculated in step 41 is greater than 63, an exponent overflow error is returned in step 45. In such case, the program proceeds to perform the arithmetic operation at issue according to the prior art emulation approach.

If, in test 47, the exponent of the e-mode number is determined to be less than 0, it is then tested in test 49 to determine whether it is less than negative 63. If so, an exponent underflow error is returned to the program in step 51. In such case, the program again proceeds to perform the arithmetic operation at issue according to the prior art emulation techniques.

If, in test 49, the exponent of the e-mode number is determined not to be less than 63, it is converted to a positive number, and the exponent sign bit is set equal to 1 in step 55. (If the sign bit is "on" the number is negative)

In the event that the exponent of the e-mode number is not less than 0 (Test 47), or after performance of step 55, step 53 is performed. In step 53, a number S is determined, where S constitutes the number of bits by which the mantissa of the IEEE number is to be shifted. This quantity S is determined by subtracting Nexp mod 3 from 16. After S is calculated, the mantissa of the e-mode number is built by shifting the mantissa of the IEEE number to the right by a number of bits equal to S Next, two tests 59, 63 are performed in order to detect rounding errors or exponent overflow errors. These tests 59, 63 are performed on the bottom S bits of the IEEE number (unshifted). In the first test 59, it is determined whether the bottom S bits of the IEEE number are equal to $2^{S-1}$. If so, a rounding error is returned in step 61. If not, the flow proceeds to step 63 wherein the bottom S bits are tested to determine whether they are greater than $2^{S-1}$. If they are not, step 75 is performed wherein, the sign bit, the exponent sign bit and exponent Eexp are placed into the appropriate locations, together with the mantissa previously determined. At this point, the e-mode number has been formed and is returned in step 77.

If test 63 determines that the bottom S bits of the IEEE number are greater than the $2^{S-1}$, the routine proceeds to step 65 wherein the e-mode mantissa is rounded up by 1. The test 67 is then performed to determine whether E is too large by testing whether E is equal to $2^{39}$. If so, step 69 is performed wherein E is set equal to $2^{38}$ and the quantity Eexp is increased by 1. After performance of step 69, the quantity Eexp is again tested to see whether it is greater than 63 in test 71. If so, an exponent overflow error is returned in step 73. If not, step 75, 77 are performed as described above. Similarly, if test 67 establishes that E is not too large, the flow proceeds to steps 75,77 to return the e-mode number as formulated.

Figure 7:
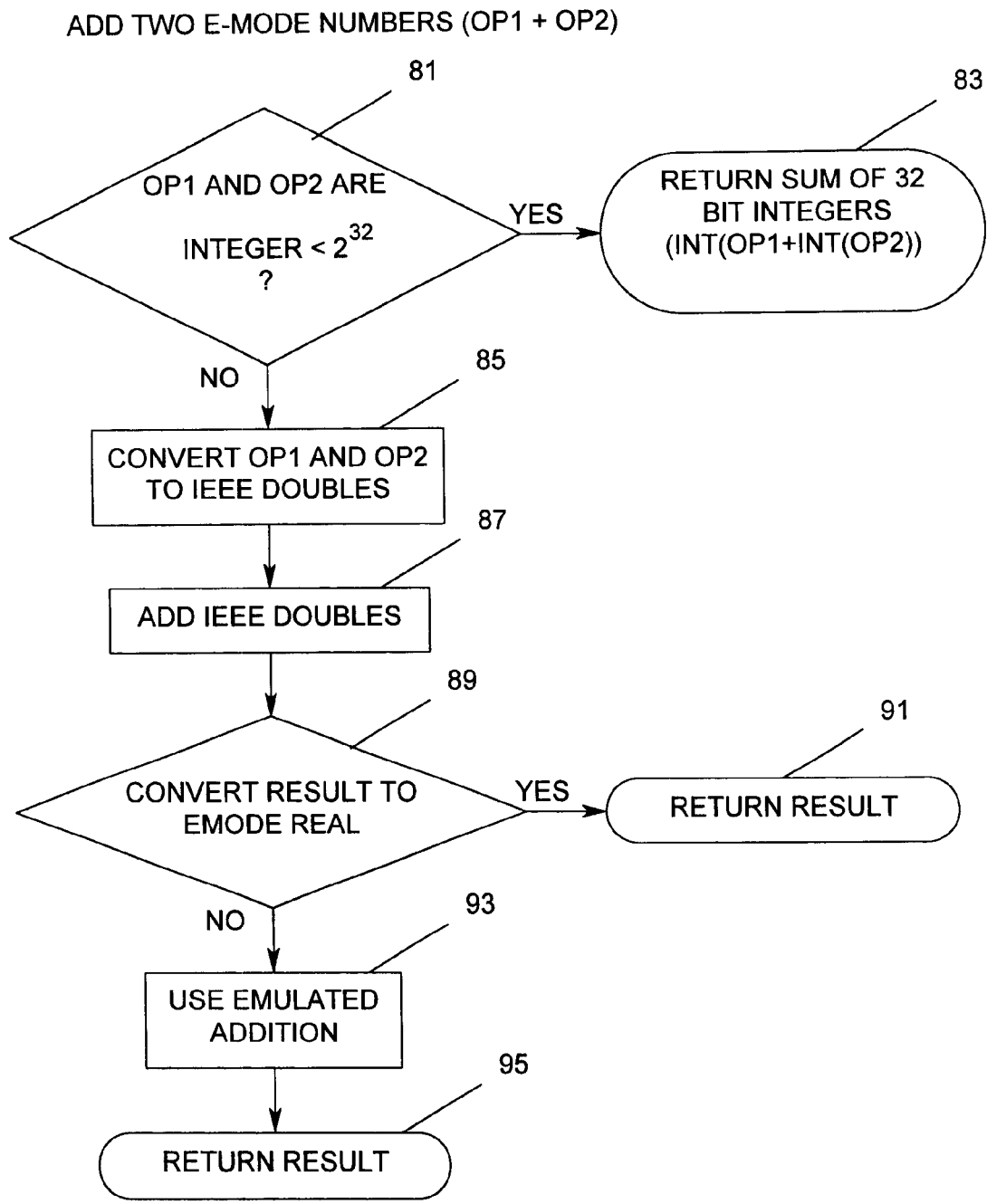
FIG. 7 illustrates a process for performing addition according to the preferred embodiment.

FIG. 7 provides an example of an arithmetic operation performed using the preferred conversion algorithm of the preferred embodiment. The particular example concerns addition of two e-mode numbers, Op1 and Op2. According to FIG. 6, a test 81 is performed to determine whether Op1 and Op2 are each less than $2^{32}$. If so, step 83 is performed wherein the sum of 32 bit integers is performed and returned, since by coincidence IEEE and E-mode numbers are the same in such case.

If Op1 and Op2 are not each less than $2^{32}$, the routine proceeds to step 85 wherein Op1 and Op2 are converted to IEEE doubles using the procedure of FIG. 4. In step 87, the IEEE double format numbers are added by the microprocessor. Then, in step 89 the result of the addition of the IEEE numbers, i.e., their sum, is converted to an e-mode real format using the process of FIGS. 5 and 6. If any of the errors identified in steps 45,61,61 or 73 of FIGS. 5 and 6 occur, the process proceeds to step 93 wherein the numbers Op1 and Op2 are added in e-mode format according to the prior art procedures and the result return in step 95, Assuming that no errors occur in step 89, the number determined by the conversion back to e-mode is returned to the emulation process in step 91.

As those skilled in the art will appreciate, the methods and apparatus of the present invention, or certain aspects or portions thereof, may take the form of program code (i.e., instructions) embodied in tangible media, such as floppy diskettes, CD-ROMS, hard drives, or any other machine-readable storage medium, wherein, when the program code is loaded into and executed by a machine, such as a computer, the machine becomes an apparatus for practicing the invention. The methods and apparatus of the present invention may also be embodied in the form of program code that is transmitted over some transmission medium, such as over electrical wiring or cabling, through fiber optics, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

Those skilled in the art will thus appreciate that various adaptations and modifications of the just-described preferred embodiments can be configured without departing from the scope and spirit of the invention. Therefore, it is to be understood that within the scope of the appended claims, the invention may be practiced other than as specifically described herein.

What is claimed is:

1. A method of emulating an arithmetic operation in a main-frame computer using a processor, the method comprising:

converting a first number in main frame format to a second number in IEEE double format using the processor, each of the first and second numbers including a respective exponent and mantissa, the converting comprising:

computing the mantissa of the second number by subtracting a quantity from the mantissa of the first number using the processor, the subtraction resulting in a shift of the mantissa of the first number; and computing the exponent of the second number based on the exponent of the first number using the processor;

performing the arithmetic operation on the second number using the processor, resulting in a third number in IEEE double format; and converting the third number to a fourth number in main frame format using the processor.

2. The method of claim 1 wherein the quantity is 2 raised to a selected power.

3. The method of claim 1 wherein the quantity is $2^{Nexp}$ where Nexp is determined by multiplying the exponent of the first number by three and subtracting 1075 from the result.

4. The method of claim 3 wherein the first number is in e-mode format.

5. The method of claim 1 wherein the first number is in e-mode format.

6. The method of claim 1 wherein computing the exponent of the second number comprises:

computing the exponent Nexp of the second number according to the formula Nexp=3×Eexp+1075 where Eexp is the exponent of the first number.

7. The method of claim 6 further including:

determining whether the exponent Eexp of the main frame format number is negative; and if so, converting it to positive prior to the multiplication by 3.

8. The method of claim 7 further including turning on the highest bit of the second number under construction if a sign bit of the first number is on.

9. A method of emulating an arithmetic operation in a main-frame computer using a processor, the method comprising:

performing the arithmetic operation on a first number in IEEE double format using the processor, resulting in a second number in IEEE double format; and converting the second number in IEEE double format to a third number in main frame format using the processor, each of the second and third numbers including a respective exponent and mantissa, the converting comprising:

computing the exponent of the third number by dividing the exponent of the second number by 3 and subtracting 353 from the result; and computing the mantissa of the third number by shifting the mantissa of the second number by S bits where S=16−Nexp mod 3, where Nexp is the exponent of the second number.

10. The method of claim 9 further including rounding the third number.

11. The method of claim 10 further including:

making a first determination that an exponent overflow or underflow error has occurred; and responding to the first determination by performing an arithmetic operation using the third number.

12. The method of claim 1 further including:

making a second determination as to whether a rounding error has occurred; and responding to the second determination by performing an arithmetic operation using the third number.

13. An article of manufacture comprising:

a computer readable medium; and computer readable program code embodied in the computer usable medium for converting a number from a main frame format to IEEE double format, each of the main frame format and the IEEE double format including a respective exponent and mantissa, the computer readable program code comprising:

computer readable program code for computing the mantissa of the IEEE double format number by subtracting a quantity from the mantissa of the main frame format number, the subtraction resulting in a shift of the mantissa of the main frame format number.

14. The article of manufacture of claim 13 wherein said quantity is 2 raised to selected power.

15. An article of manufacture comprising:

a computer usable medium; and computer readable program code embodied in the computer usable medium for converting an IEEE double format number to main frame format number, each of the main frame format number and the IEEE double format number including a respective exponent and mantissa, the computer readable program code comprising:

computer readable program code for computing the exponent of the main frame format number by dividing the exponent of the IEEE double format number by 3 and subtracting 353 from the result; and computer readable program code for computing the mantissa of the main frame format number by shifting a mantissa of the IEEE double format number by S bits where S=16−Nexp mod3, where Nexp is the exponent of the IEEE double format number.

16. The article of manufacture of claim 15 wherein the computer readable program code further comprises:

computer readable program code for making a first determination that an exponent overflow or underflow error has occurred; and responding to said first determination by performing an arithmetic operation using the main frame format number.

17. The article of manufacture of claim 15 wherein the computer readable program code further comprises:

computer readable program code for making a second determination as to whether a rounding error occurred; and computer readable program code for responding to said second determination by performing an arithmetic operation using the main frame format number.

18. A storage medium encoded with machine-readable computer program code executable by a computer to perform a method for converting a number from a main frame format to IEEE double format, each of the main frame format and the IEEE double format including a respective exponent and mantissa, the method comprising the step of:

computing the mantissa of the IEEE double format number by subtracting a quantity from the mantissa of the main frame format number, the subtraction resulting in a shift of the mantissa of the main frame format number.

19. The storage medium of claim 18 wherein the method further includes the step of computing the exponent of the IEEE double format number based on the exponent of the main frame format number.

20. The storage medium of claim 18 wherein, in the step of computing the mantissa, said quantity is 2 raised to a selected power.

21. The storage medium of claim 18 wherein said main frame format number is in e-mode format.

22. A storage medium encoded with machine-readable computer program code executable by a computer to perform a method for converting a number from an IEEE double format to a main frame format, the method comprising the steps of:

computing an exponent of a main frame format number by dividing an exponent of an IEEE double number by 3 and subtracting 353 from the dividend; and a shifting a mantissa of the main frame format number by S bits where S=16−Nexp mod3, where Nexp is an exponent of the IEEE double number.

23. The storage medium of claim 22 wherein the method further comprises the step of:

making a first determination that an exponent overflow or underflow error has occurred; and responding to said first determination by performing an arithmetic operation using the main frame format number.

24. The storage medium of claim 23 wherein the method further comprises the steps of:

making a second determination as to whether a rounding error has occurred; and responding to said second determination by performing an arithmetic operation using the main frame format number.

* * * * *